United States Patent [19]

Dent

[11] Patent Number: 5,793,617
[45] Date of Patent: Aug. 11, 1998

[54] SHORTER COMPACT EXPANSION CARD TO REPLACE AN EXTENDED INDUSTRY STANDARD ARCHITECTURE (EISA) CARD

[75] Inventor: David Dent, Beaverton, Oreg.

[73] Assignee: Intel Corporation, Santa Clara, Calif.

[21] Appl. No.: 676,889

[22] Filed: Jul. 8, 1996

Related U.S. Application Data

[63] Continuation-in-part of Ser. No. 393,458, Feb. 23, 1995, abandoned.

[51] Int. Cl.⁶ .................................................. H01R 23/68
[52] U.S. Cl. .......................... 361/785; 361/791; 361/799; 439/924.1
[58] Field of Search ............................. 174/261; 361/784, 361/791, 786, 788, 789, 785, 797, 799, 800, 802, 803; 439/59, 60, 61, 637, 924.1; 364/708.1; 395/281, 282, 306, 307, 308, 309, 402, 822

[56] References Cited

U.S. PATENT DOCUMENTS

| | | | |
|---|---|---|---|
| 3,149,893 | 9/1964 | Dupre | 439/60 |
| 5,024,609 | 6/1991 | Piorunneck | 439/637 |
| 5,061,190 | 10/1991 | Medeiors et al. | 439/60 |
| 5,295,843 | 3/1994 | Davis et al. | 439/924.1 |

FOREIGN PATENT DOCUMENTS 53-26978   3/1978   Japan ............................ 439/637

*Primary Examiner*—Donald Sparks
*Attorney, Agent, or Firm*—Owen L. Lamb

[57] ABSTRACT

A compact expansion card to replace an Extended Industry Standard Architecture (EISA) card. An EISA card has an edge connector of 188 pins of a given width and a given gap between pins, in 5.5 inches, two rows on a front of the EISA card and two rows on a back of the EISA card. The 188 pins include 157 signal pins, 10 pins dedicated to a +5 volt supply, and 18 pins dedicated to ground. The compact expansion card has an edge connector of 162 pins in 4.5 inches in two rows, one row of 81 pins on a front of the compact card and one row of 81 pins on a back of the compact card, a gap between each of the 162 pins being the same as the given gap between pins of the EISA card. The 162 pins include 157 signal pins, one +5 volt pin dedicated to a +5 volt supply, and one ground pin dedicated to ground. The 157 signal pins are of the same given width as the 157 signal pins of the EISA card. The +5 volt pin is a ten times multiple in width of a signal pin to carry electrical currents that are higher than currents through a signal pin. The one ground pin is an eighteen times multiple in width of a signal pin to carry electrical currents that are higher than currents through a signal pin.

2 Claims, 2 Drawing Sheets

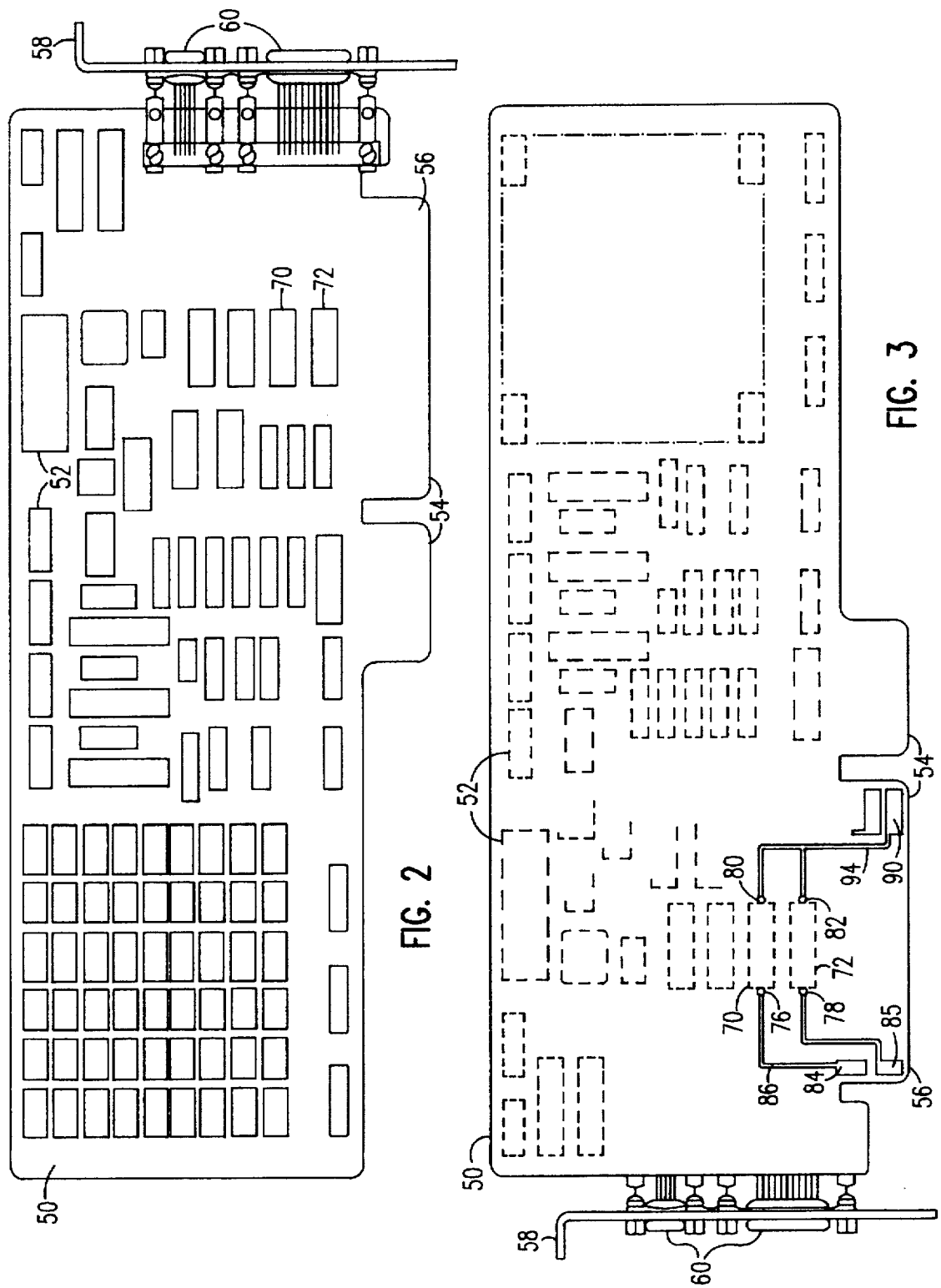

SHORTER COMPACT EXPANSION CARD TO REPLACE AN EXTENDED INDUSTRY STANDARD ARCHITECTURE (EISA) CARD

This application is a continuation-in-part of application Ser. No. 08/393,458, filed Feb. 23, 1995, now abandoned.

BACKGROUND OF THE INVENTION

1. Field of the Invention

The present invention is related to personal computers and more particularly to an improved expansion card edge connector used in a motherboard of a computer.

2. Background Art

Printed circuit boards are thin, plastic boards or cards that have electronic components soldered on one side and printed wiring sandwiched between layers of the card. The printed wiring routes electronic signals from component to component and provides a number of printed connectors at an edge on both sides of the card that are also routed to components on the card. The edge connectors allow the cards to be plugged into a socket that is soldered onto another printed circuit card. The availability of the printed circuit technology and very small microprocessors that fit on a printed circuit card made possible the personal computer.

A personal computer is a stand-alone desktop computer housed in a chassis which is a cover that protects the computer components from the environment and the environment from the computer, such as electromagnetic interference (EMI). Input/output (I/O) devices, such as a video monitor, mouse and printer are connected to a back panel of the chassis by means of cables that plug into connectors at a back panel of the chassis. Inside the chassis is a system board, called a motherboard, that holds the electronic components of the computer.

Up to eight receptacles (slots) are provided for adapter boards that allow compatible circuit boards (expansion cards) to be added to the computer to expand the computer's capability. The eight slot connectors provide for user expansion to add features, such as sound capability or fax and modem communication capability, by add-in cards that have these features on them. The expansion add-in adapter cards are inserted into one or more of the eight slots which include eight connectors (sockets) that are mounted and soldered directly on the motherboard. The motherboard has printed circuit wiring that distributes the I/O signals from the add-in cards to appropriate components on the motherboard via an expansion bus. The expansion bus is an extension of the computer's address and data bus.

An expansion card having a 96-pin card edge connector is used for the IBM PC/AT and compatible personal computers. The edge connectors are printed on both sides of the card, there being 48 connectors on each side, and requires 5.5 inches of card edge connector space for the connector male pins that mate with female connector pins in a socket on the mother board. This type of connector is readily available in several styles (ISA, EISA, MicroChannel, and others). It has become very cost effective and is used in non-traditional applications.

In one such application, an EISA connector has become a defacto standard for connectors on LPX motherboards to support both the older Industry Standard Architecture (ISA) signals and the newer Peripheral Control Interface (PCI) signals. The Extended Industry Standard Architecture (EISA) connector has 188 pins and uses the same 5.5 inches of card edge connector space as the above described 96 pin card. This is achieved by providing an edge connector that extends deeper into the socket than the ISA card edge connector. The socket is provided with two additional rows of contacts that are deeper in the socket than the ISA contacts. Each of the additional rows has 46 contacts. Thus, an EISA card has a total of 188 contacts, 92 below and in addition to the original 96 ISA contacts above, almost double the ISA card pins. Because the current carrying capacity of each pin/socket is limited, several pins are used for some voltages and ground on both the ISA card and the EISA card configuration.

U.S. Pat. No. 5,024,609 to Piorunneck discloses a printed circuit card connector including a card socket comprised of a power module and a signal module. The power module is locked onto the signal module. A printed circuit card inserts into the card socket. A wide edge connector is provided on the card on a separate power section that engages the power module. Narrow edge connectors are provided on the card on a separate signal section that engages the signal module. The card has a recess to accommodate an end wall that separates the power module and the signal module when the card is inserted into the socket. In U.S. Pat. No. 5,024,609 the card edge connector length is longer that it would be without this recess.

It is desirable to have a card design which enables the card edge to be shortened such that a single socket can be made shorter, thus freeing up more area on the motherboard in which the socket is used.

U.S. Pat. No. 3,149,893 to Dupre discloses a printed circuit connector in which a grounding bus bar is mounted external to a slot in a connector socket that receives a printed circuit card. The grounding bus bar has spring finger contacts that engage ground contacts on the printed circuit card.

U.S. Pat. No. 5,295,843 to Davis et al. discloses an electrical connector having male and female portions that connect together to complete an electrical path. U.S. Pat. No. 5,295,843 does not disclose a printed circuit card that is inserted into a slot of a connector.

It is desirable to have a card design in which all card pins engage connectors within the slot into which the card is inserted such that the ground connectors are at the edge of the card as is the standard for IBM compatible personal computers.

U.S. Pat. No. 5,061,190 to Medeiors et al. discloses a card having edge connectors that vary in width and height to accommodate existing 8-bit STD connectors and the newer 32-bit cards. The card uses fingers of two different types. Some of the fingers are made wider to carry more current by combining one finger of one type with one finger of another type and filling in the space between them with metal. While this increases the current carrying ability, it does not result in a shorter card and a smaller socket for the card, which is a desired feature. The older 8-bit card is made to fit in the same socket that accepts the new 32-bit card. The card edge length and socket length are the same for both 8-bit and 32-bit cards.

A new type of edge connector is needed that uses less space yet still accommodates all of the signal requirements.

SUMMARY OF THE INVENTION

Briefly, the invention is concerned with a compact expansion card to replace an Extended Industry Standard Architecture (EISA) card. An EISA card has an edge connector of 188 pins of a given width and a given gap between pins, in 5.5 inches, two rows on a front of the EISA card and two rows on a back of the EISA card. The 188 pins include 157 signal pins, 10 pins dedicated to a +5 volt supply, and 18 pins dedicated to ground. The compact expansion card of this invention has an edge connector of 162 pins in 4.5 inches in two rows, one row of 81 pins on a front of the compact card and one row of 81 pins on a back of the compact card, a gap between each of the 162 pins being the same as the given gap between pins of the EISA card. The 162 pins include 157 signal pins, one +5 volt pin dedicated to a +5 volt supply, and one ground pin dedicated to ground. The 157 signal pins are of the same given width as the 157 signal pins of the EISA card. The +5 volt pin is a ten times multiple in width of a signal pin to carry electrical currents that are higher than currents through a signal pin. The one ground pin is an eighteen times multiple in width of a signal pin to carry electrical currents that are higher than currents through a signal pin.

In accordance with an aspect of the invention, a mating socket is provided that has a slot therein in which 162 mating connectors are provided that mate with the 162 edge connector pins on the compact expansion card. The connectors include a voltage mating connector connected to the +5 volt supply and aligned to mate with the +5 volt pin and a ground mating connector connected to ground and aligned to mate with the one ground pin dedicated to ground.

The invention has the advantage that it reduces connector length making trace routing easier, sockets smaller, and mother boards less costly.

BRIEF DESCRIPTION OF THE DRAWINGS

FIG. 2 is a front view of a compact card edge connector in accordance with the present invention;

FIG. 3 is a back view of the compact card edge connector of FIG. 2;

DESCRIPTION OF THE PREFERRED EMBODIMENT

Card edge connectors are commonly used for expansion in the PC industry. A 96-pin card edge connector is used for the IBM PC/AT and compatible personal computers that conform to the Industry Standard Architecture (ISA). The edge connectors are printed on both sides of the card, there being 48 connectors on each side requiring 5.5 inches of card edge connector space for the connector male pins that mate with female connector pins in a socket on the mother board.

Figure 1:
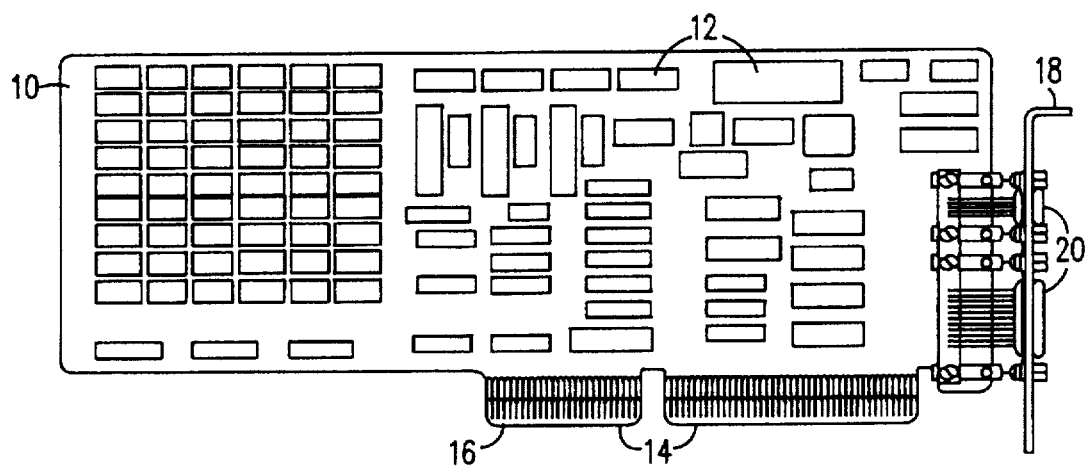
FIG. 1 is a front view of a prior art PC/AT computer 188-pin EISA expansion card.

An Extended Industry Standard Architecture (EISA) card has become the defacto standard for a riser connector on LPX motherboard to support both Industry Standard Architecture (ISA) and Peripheral Control Interface (PCI) signals and is shown in FIG. 1. The EISA card (10) has flat printed wiring sandwiched in layers of the card and components (12) soldered onto the printed wiring that routes current between the components and to an edge connector (14). The card has a bracket (18) that fits into a slot on a back panel of the computer chassis. The bracket (18) is fitted with input/output connectors (20) that are plugs into which cables such as telephone cables are inserted if the card functions as a telecommunications modem.

The edge connector (14) has 188 pins (16) in 5.5 inches two rows on the front and two rows on the back of the card. The 188 signal pins are of equal width and are equally spaced; that is, the gap between pins is the same. The breakdown of the 188 pins is as shown in the column labeled "prior Art" in TABLE I.

Refer to FIG. 2 which is a front view of a compact card edge connector in accordance with the present invention and FIG. 3 which is a back view of the compact card edge connector of FIG. 2.

The card (50) has flat printed wiring sandwiched in layers of the card and components (52) soldered onto the printed wiring that routes current between the components and to an edge connector (54). The card has a bracket (58) that fits into a slot on a back panel of the computer chassis. The bracket (58) is fitted with input/output connectors (60) that are plugs into which cables such as telephone cables are inserted if the card functions as a telecommunications modem.

The edge connector (54) has 162 pins (56) in 4.5 inches in two rows, one row of 81 pins on the front and one row of 81 pins on the back of the card. The breakdown of the 162 pins is as shown in the column labeled "invention" in TABLE I.

TABLE I

| PIN DEFINITION | PRIOR ART | INVENTION |
| --- | --- | --- |
| +12 V | 1 PIN | 1 PIN |
| -12 V | 1 PIN | 1 PIN |
| +5 V | 10 PINS | 1 PIN |
| -5 V | 1 PIN | 1 PIN |
| GROUND | 18 PINS | 1 PIN |
| SIGNAL LINES | 157 PINS | 157 PINS |
| TOTAL PIN COUNT | 188 PINS | 162 PINS |

The +5 volt pin (90) has a much higher current carrying capacity and is wider than other pins to carry electrical currents that are higher than the currents through other pins (84, 85) that are dedicated to signal outputs from components on the card. The ground pin is also wider to provide a much higher current carrying capacity. The 157 signal pins are the same size as the pins of the prior art card shown in FIG. 1, as no increase in current is anticipated. The 162 signal pins while of differing widths are equally spaced; that is, the gap between pins is the same.

This new type of connector uses less space yet still accommodates all of the signal requirements. This is accomplished by increasing the contact area of the voltage and ground connectors such that several pins are combined into one. For example, in the prior art, 10 pins are dedicated to the +5 volt supply. By combining these pins into one wide pin, a much smaller area of the card is needed, since the space between pins needed in the prior art for 10 pins is eliminated. Likewise, in the prior art, 18 pins are dedicated to ground. By combining these pins into one wide pin, a much smaller area of the card is needed, since the space between pins needed in the prior art for 18 pins is eliminated. The 188 pin EISA connector used in a LPX/PCI system is reduced to 162 pins, taking up 4.5 inches of linear connector length. Thus approximately 1 inch is saved from the connector length making trace routing easier and motherboards more cost-effective.

To summarize, FIGS. 2 and 3 show contact areas that are increased in surface area to carry the increased current for power and ground traces. A printed circuit card (50) has a first printed circuit pin of a first width at an edge (54) of the card. Components (70, 72) are located on the card having a signal terminals (76, 78) and component voltage terminals (80, 82). A first printed circuit pin (84) is connected by a first printed circuit trace (86) to the signal terminal (76) of one of the components (70). The component (70) carries a current of a first magnitude through the first printed circuit pin (84). A second printed circuit pin (90) of a second width at the edge of the card has a second width being greater than the first width. Another component (72) located on the card has a second component voltage terminal (82). The second printed circuit pin is connected by a second printed circuit trace (94) to the component voltage terminals of all components. The second printed circuit pin carries an electrical current of a second magnitude that is greater than the first magnitude.

Figure 4:
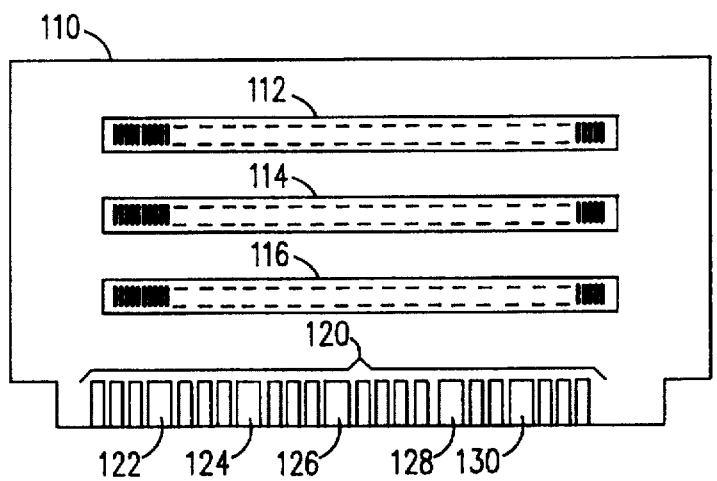
FIG. 4 is a front view of a riser card in accordance with the present invention.
Figure 5:
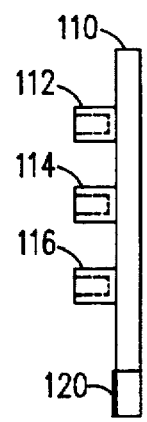
FIG. 5 is a side end view of the riser card of FIG. 4.

Refer to FIG. 4 which is a front view and FIG. 5 which is a side end view of a riser card in accordance with the present invention. A personal computer is housed in a chassis having a bottom panel and a rear panel perpendicular to the bottom panel. The rear panel has cutouts to accommodate connectors that connect the computer electronics to peripheral devices. A large printed circuit board at the bottom of the chassis, called a system board or motherboard (100), holds the computer's control circuit and other electronics. LPX mother boards use a riser card (110) Input/output (I/O) hardware options in the form of printed circuitry cards are plugged directly into expansion slots on the riser cards.

Figure 6:
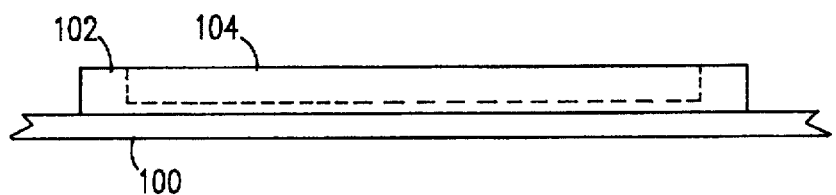
FIG. 6 is a front view of a mating socket on a mother board for the the riser card of FIG. 5; and, FIG. 7 is a side end view of the mating socket shown in FIG. 7.
Figure 7:
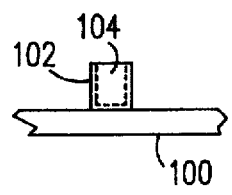

The mother board (100) includes a mating socket (102). FIG. 6 is a front view and FIG. 7 is a side end view of the mating socket on the mother board for the riser card shown in FIG. 4 and FIG. 5. The mating socket has a slot (104) therein in which mating connectors are provided that connect with edge connectors (120) on the riser card. The mating connectors are wired to an I/O system bus on the mother board.

The I/O riser card (110), a small printed circuit board, is designed to mount in the socket (102) perpendicular to the motherboard (100). The I/O riser card has expansion card connector sockets (112, 114, 116) mounted on the I/0 riser card. The connectors are mounted perpendicular to the I/O riser card and receive expansion cards such as the card described with reference to FIG. 2 and FIG. 3.

The edge connector (120) has 162 pins (not all are shown) in 4.5 inches in two rows, one row of 81 pins on the front and one row of 81 pins on the back of the riser card (110). The breakdown of the 162 pins is the same as shown in the column labeled "invention" in TABLE I. The five wide pins (122, 124, 126, 128, 130) correspond to −12 v, +12 v, ground, +5 v and −5 v, respectively, and connect with mating pins in the mating socket (102) that are wired to −12 v, +12 v, ground, +5 v and −5 v, respectively, on the mother board (100). The 162 signal pins while of differing widths are equally spaced; that is, the gap between pins is the same.

Those skilled in the art will realize that the teachings of the invention with respect to wider traces for voltage and ground pins to accept electrical current are applicable to either EISA type (i.e. stacked contact) connectors or micro channel type (finer pitch contacts than ISA) connectors. Those skilled in the art will also realize that the pin contact force can be increased to achieve the highest current carrying capacity in the smallest contact area.

SUMMARY

In prior standard printed circuit cards, at an edge of the card are signal pins, which are of equal width and are equally spaced, that is the gap between pins is the same. A new type of connector in accordance with the teaching of the present invention uses less space yet still accommodates all of the signal requirements of prior standard printed circuit cards. This is accomplished by increasing the contact area of the voltage and ground connectors such that several pins are combined into one. For example, in the prior art, 10 pins are dedicated to a +5 volt supply. By combining these pins into one wide pin, a much smaller area of the card is needed, since the gap between pins needed in the prior art for 10 pins is eliminated. Likewise, in the prior art, 18 pins are dedicated to ground. By combining these pins into one wide pin, a much smaller area of the card is needed, since the gap between pins needed in the prior art for 18 pins is eliminated. The 188 pin EISA connector used in a LPX/PCI system is reduced to 162 pins, taking up 4.5 inches of linear connector length. Thus approximately 1 inch is saved from the connector length making trace routing easier and motherboards more cost-effective.

While the invention has been particularly shown and described with reference to preferred embodiments thereof, it will be understood by those skilled in the art that the foregoing and other changes in form and detail may be made therein without departing from the scope of the invention.

What is claimed is:

1. A computer printed circuit card connector system including a compact expansion card to replace an Extended Industry Standard Architecture (EISA) card, said EISA card having an EISA edge connector of 188 pins of a given width and a given gap between pins in 5.5 inches, two rows on a front of said EISA card and two rows on a back of said EISA card, said 188 pins including 157 signal pins, 10 pins dedicated to a +5 volt supply, and 18 pins dedicated to ground, said 188 pins being of a given width and a given gap between pins, said computer printed circuit card connector system comprising:

an edge connector of 162 pins in 4.5 inches in two rows, one row of 81 pins on a front of said compact card and one row of 81 pins on a back of said compact card, a gap between each of said 162 pins being the same as said given gap between pins of said EISA card;

said 162 pins including 157 signal pins, one +5 volt pin dedicated to a +5 volt supply, and one ground pin dedicated to ground;

said 157 signal pins being of the same given width as said 157 signal pins of said EISA card;

said +5 volt pin being of a ten times multiple in width of a signal pin to carry electrical currents that are higher than currents through a signal pin;

said one ground pin being of an eighteen times multiple in width of a signal pin to carry electrical currents that are higher than currents through a signal pin.

2. The computer printed circuit card connector system of claim 1 further comprising:

a mating socket;

said mating socket having a slot therein in which 162 mating connectors are provided that mate with said 162 edge connector pins on said compact expansion card;

said 162 mating connectors including a voltage mating connector;

said voltage mating connector being connected to said +5 volt supply and aligned to mate with said +5 volt pin;

said 162 mating connectors including a ground mating connector;

said ground mating connector being connected to ground and aligned to mate with said one ground pin dedicated to ground.

* * * * *